(12) United States Patent
Holmberg

(10) Patent No.: US 6,347,034 B1
(45) Date of Patent: Feb. 12, 2002

(54) ARRANGEMENT AT A PORTABLE ELECTRIC APPARATUS

(75) Inventor: Per Holmberg, Dalby (SE)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 0 days.

(21) Appl. No.: 09/501,623

(22) Filed: Feb. 9, 2000

(30) Foreign Application Priority Data

Feb. 18, 1999 (SE) ................................................ 9900566

(51) Int. Cl.[7] .................................................. H02B 1/00
(52) U.S. Cl. ...................... 361/600; 361/679; 361/814
(58) Field of Search ........................ 361/690, 694–695, 361/814; 429/99–100, 26; 248/82, 83, 632–634; 455/89–90, 95

(56) References Cited

U.S. PATENT DOCUMENTS 5,583,742 A  12/1996  Noda et al.
5,668,349 A  * 9/1997  Durham et al. ............... 429/82

FOREIGN PATENT DOCUMENTS

FR  2758873 A1  7/1998
WO  9813273 A1  4/1998

OTHER PUBLICATIONS

Patent Abstracts of Japan, abstract of JP 10–126713 A (Showa Tekko KK), May 1998, abstract.
Patent Abstracts of Japan, abstract of JP 6–31130 A (NEC CORP), Feb. 1994, abstract.

* cited by examiner

Primary Examiner—Gregory Thompson
(74) Attorney, Agent, or Firm—Nixon & Vanderhye P.C.

(57) ABSTRACT

Arrangement at a portable electric apparatus having a main unit containing electronic equipment, and a power source unit. The arrangement is designed to allow ventilation of gaseous media in both directions inside and out from the main unit and from the main unit and from the power source unit due to changes in ambient temperature. One or more channels are provided for ventilating gasesous media in a controlled fashion via vent orifices in one or both units.

11 Claims, 4 Drawing Sheets

ARRANGEMENT AT A PORTABLE ELECTRIC APPARATUS

TECHNICAL FIELD OF THE INVENTION

The present invention relates to an arrangement at a portable electric apparatus comprising a main apparatus unit containing electronic equipment necessary therefore, and a detachable power source unit, the latter being disconnectably fixed to or in the apparatus unit, the arrangement being designed to allow ventilation of gaseous media in both directions inside and out from the apparatus unit as well as the power source unit to the atmosphere and vice versa due to changes in ambient temperature. More particularly, the present invention relates to a radio telephone having a removable rechargable battery pack

DESCRIPTION OF THE PRIOR ART

Previously known solutions for similar purposes are like the one according to EP A1 0 831 572, mainly filter members for suppressing the likelyhood that particles and other unwanted material enter the interior of a device.

Electronic equipment, normally consuming electric energy, stored in some kind of battery attached to or housed in the equipment, is normally effected by said energy consumption since the temperature of the battery rises as its energy is consumed. If the battery is rechargeable, which often or normally is the case, also the recharging generates a substantial amount of heat as well as sometimes the emission of hydrogen gas. Variation in temperature normally gives rise to vaporization and condensation, creating moisture almost everywhere. Such moisture and possibly emitted hydrogen gas in connection with mobile telephones, until now, has been tackled by natural leakage at joints and edges.

Electronic components of mobile telephones, like electronics overall, are normally not supposed to be exposed to moisture, since this enhances the risk for short circuiting as well as the risk of oxidation, which given time can destroy a component totally. These phenomena may become especially frequent when using mobile telephones in extreme environments, such as in the tropics, where its user sometimes may stay indoors in air-conditioned circumstances at 20° C. and a humidity of 60% and at other times is staying outdoors at temperatures of maybe up to 70° C. and humidities of maybe 90%. During such extreme conditions, the performance of almost any electronic devices or equipment may degenerate quickly.

It is therefore an object with the present invention to develop an arrangement for positively ventilating gas (mainly vaporized moisture in air and hydrogen gas) contained and/or generated inside a mobile telephone to the exterior thereof as well as providing means for submitting gas (air and no moisture) to the interior thereof in a controlled fashion, avoiding exposure of sensitive electronic equipment to moisture normally in the atmosphere.

Another object with the present invention is to provide a mobile telephone, which is water-protected, i.e., can withstand accidental exposure to water, but is not necessarily waterproof.

Another object is to provide a mobile telephone, which by the arrangement of channels for achieving a positive ventilation, also creates a pressure equalizer that equalizes possible internal positive or negative pressure that may result from such a water protection design. In water protected electronic equipment, the problem regarding moisture, whether condensated or vaporized and/or hydrogen gas, becomes worse in the absence of some kind of ventilation arrangement. The enclosed moisture, including possibly hydrogen gas, becomes more and more concentrated and may when released, for instance when charging a battery, oxidize into oxyhydrogen gas. If an ignition occurs, for instance a spark when releasing the battery, this resulting gas reacts according to the formula:

a reaction which is more or less like an explosion.

SUMMARY OF THE INVENTION

According to the invention, means are provided for freely/positively [admitting] ventilating gaseous media, (e.g., air and hydrogen gas), in a controlled fashion via orifices in discrete components and/or compartments in the equipment. The means includes a channel or integrated channels encompassing the orifices in order to equalize air pressure in reach of the components or compartments. Ventilation of vaporized moisture, e.g., containing air and hydrogen gas, is performed in a controlled fashion via such channel(s) so that the moisture quickly evaporates without affecting surrounding equipment.

In a farther embodiment, the ends of the channel(s) are collected to a mutual outlet to the outside of the telephone. This outlet at its outer end is equipped with filtering media, preferably made from a material having a "breathing" ability/function, like for instance GORE-TEX®.

In a further embodiment, the channels are systematically arranged in for instance a honeycomb structure, regularly or irregularly spirally wound in one or more layers. This structure catches vaporized moisture or other gas at the spot(s) where they are the most concentrated.

The channels may also structurally strengthen a housing/shell for a mobile telephone. The channels are arranged in connection with a shell and thereby affects the moment of inertia thereof.

With the invention, a water-protected telephone may be provided without developing above- or sub-atmospheric pressure inside of the telephone.

BRIEF DESCRIPTION OF THE DRAWINGS

Below the invention is described more in detail with reference to the enclosed drawings, in which.

DETAILED DESCRIPTION

Figure 1:
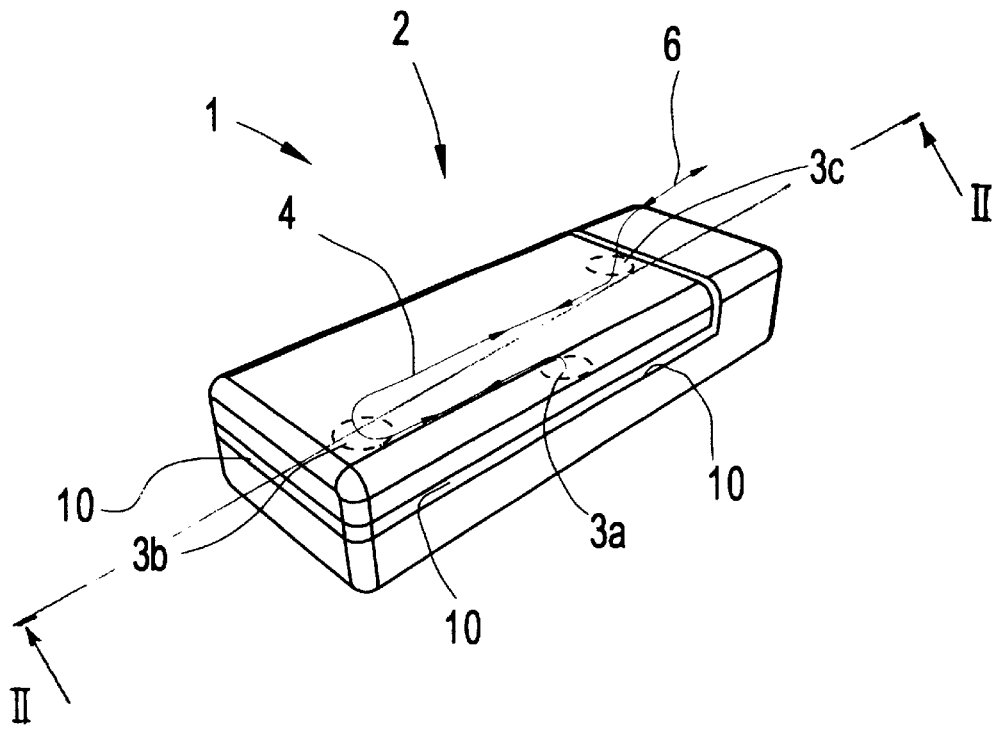
FIG. 1 shows a simplified perspective view of a mobile telephone comprising an arrangement according to the invention.
Figure 2:
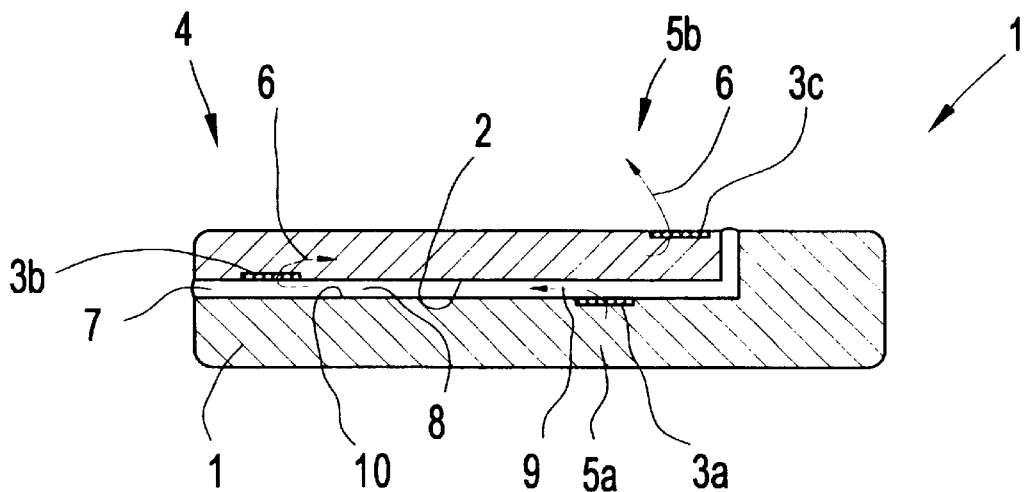
FIG. 2 shows a cross section from II—II in FIG. 1.

In a simplified embodiment of a mobile telephone which in FIG. 1 and 2 is shown for illustrative purposes only, the inventive embodiment comprises a housing 1 and a removably fixed battery 2 as well as three vents 3a, 3b, 3c. One of these vents 3a is arranged on an upper portion 5a of the housing 1 of the mobile telephone, whilst the other two vents 3b and 3c are arranged on the battery 2, the vent 3b on the rear side lower portion 4 of the battery 2, and the vent 3c on the outside upper portion 5b of the battery 2.

With a tiny sketch line 6 provided with arrows, the transport through the vents is shown in both FIG. 1 and FIG. 2. By arranging the holes 3a and 3b at such a relatively long distance from each other, the air heated by the battery can attract moisture and vaporize it over a distance in the space from around 7 and 8 and further around 9 in the space between the housing 1 and the battery 2. A sealing 10 is arranged along the edge of the battery 2 and the housing 1, to attain water protection. The holes 3a–3c, are each covered by a polymer membrane 13 of a "breathable material" such as GORE-TEX®. Since such a material only allows the penetration of gas and vaporized moisture, the telephone is water-protected in spite of being ventilated.

Figure 3:
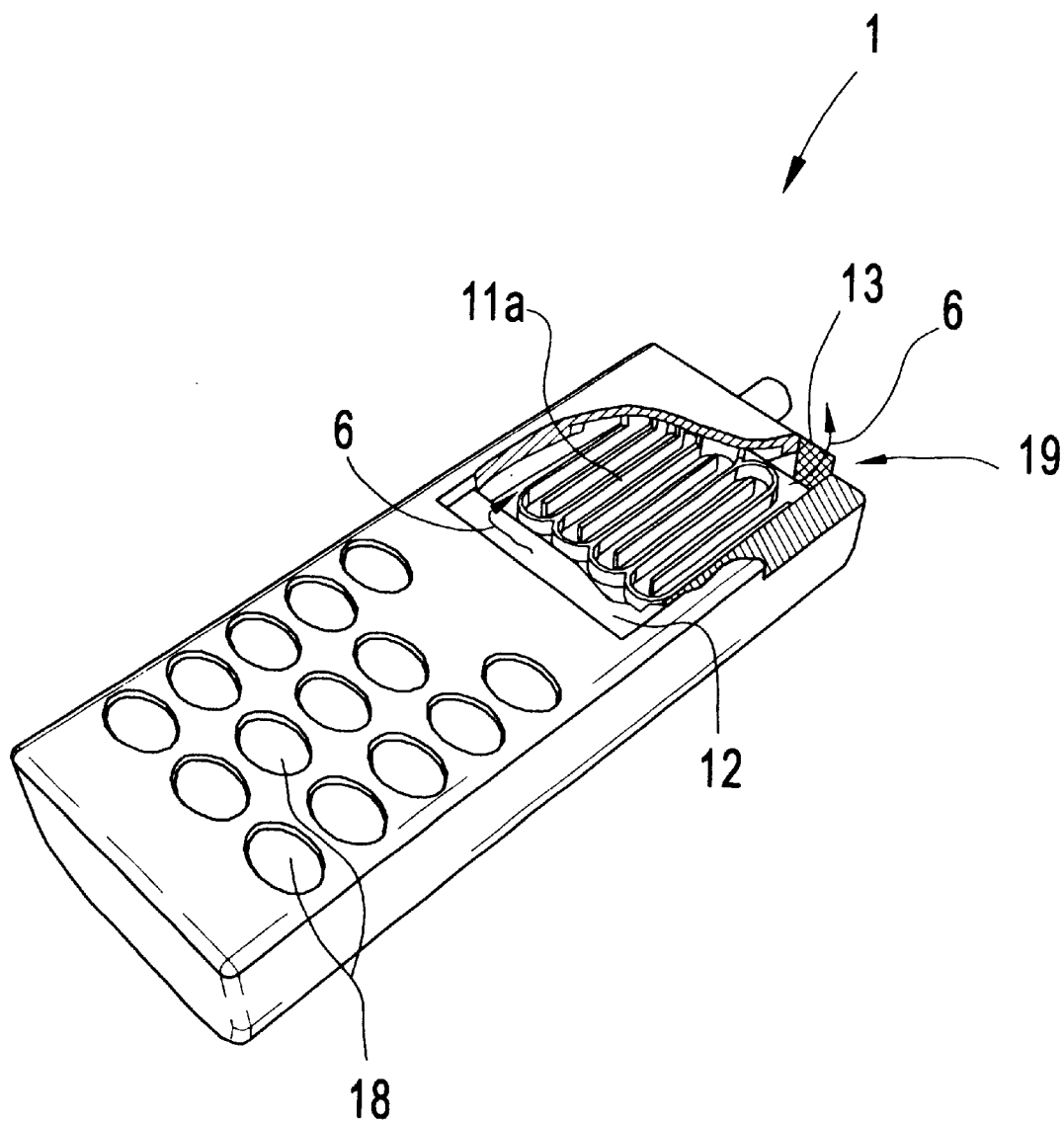
FIG. 3 shows a less simplified perspective view of a mobile telephone, the housing of which here shows the cavities for a keypad, and on which a partially cut away portion shows an arrangement according to the invention.

FIG. 3 shows a further developed arrangement on a mobile telephone according to the invention, according to which a continuous channel 11a, like a maze, is arranged behind the area where normally a display 12 of a telephone is situated and is coupled to a vent orifice 19. FIG. 3 also includes key-pad cavities 18, the purpose of which is well known to the skilled man. The primary purpose of this design is to achieve a channel having an extended length that functions when air is sucked into the phone due to a sudden lowered temperature and condenses on the walls of the lengthy channel. As a result, no moisture will reach the components of the telephone. The extension of the channel according to this embodiment, at the rear side of the display of the telephone, makes ventilation of said display as well reasonably easy. In such a case, the rear side of the display may be penetrated at chosen spots. These spots are in turn provided with a breathable membrane according to the above allowing potential moisture inside the display unit to evaporate.

Figure 4:
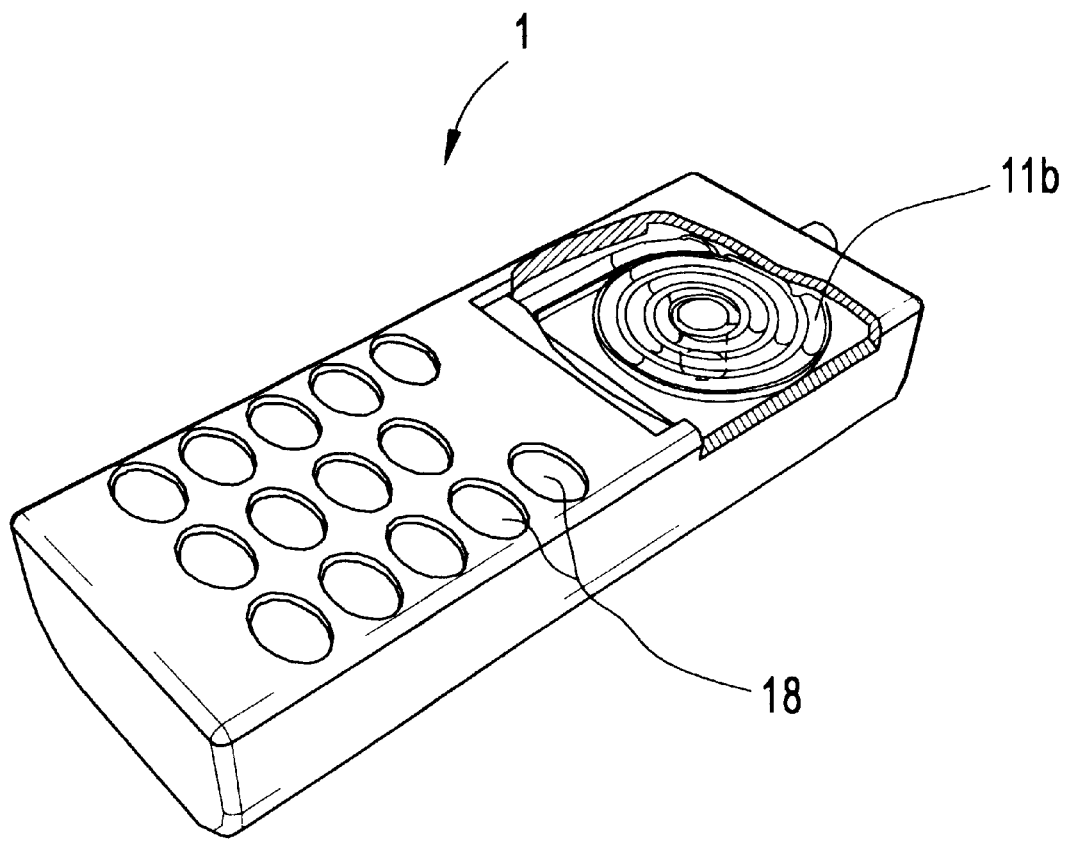
FIG. 4, analogous with FIG. 3, shows an alternate embodiment of a channel configuration according to the invention.
Figure 5:
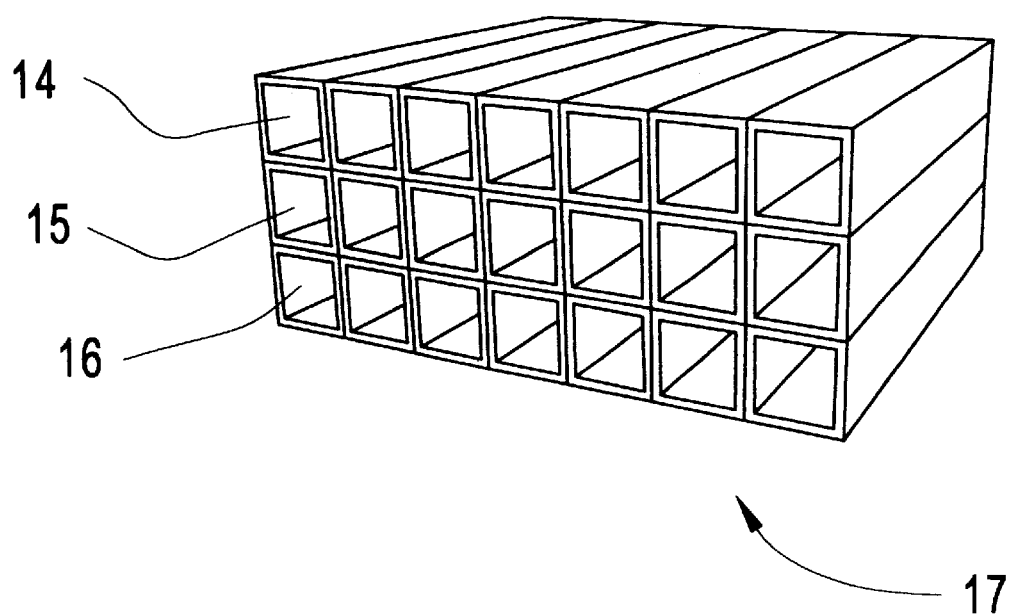
FIG. 5 shows a perspective view of a cutaway portion of a channel which comprise a honeycomb structure according to the invention.

According to FIG. 4, another inventive embodiment is shown having a spirally wound channel 11b. The channels 11a and 11b may be differently shaped depending upon their purpose. The channels may also be differently shaped and/or arranged in several layers 14, 15, 16. FIG. 5 constitutes a honeycomb structure 17. When so arranged the channels may become longer, which means that a larger amount of vaporized moisture may condense on the walls thereof. As shown, the channel/channels have at least one opening to the interior of the telephone as well as at least one opening to its exterior (having a breathable membrane), e.g., vent or outlet 19. The channels may have different cross-sections in different parts of the telephone. This enhances the possibilities of forced condensation due to laws of Physics, i.e., a constriction speed of the media becomes higher which promotes condensation.

Combinations of the differently shaped channels and sub-features thereof, are of course possible and also considered protected under the appended claims. While the present invention has been described with respect to particular example embodiments, those skilled in the art will recognize that the present invention is not limited to those specific embodiments described and illustrated herein. Different formats, embodiments, adaptations besides those shown and described, as well as many modifications, variations and equivalent arrangements may also be used to implement the invention. Although the present invention is described in relation to preferred example embodiments, it is to be understood that this disclosure is only illustrative and exemplary of the present invention. The scope of the invention is defined by the appended claims.

What is claimed is:

1. Electronic apparatus comprising:
   a main unit including electronic communications circuitry;
   a detachable power source detachably coupled to the main unit;
   at least one channel coupled to at least one vent orifice located on the outside of the electronic apparatus for channeling gas contained in the electronic apparatus to the at least one vent orifice to ventilate gas in the electronic apparatus; and
   wherein said channel for channeling the gas is at least partially located inside of the detachable power source.

2. The electronic apparatus according to claim 1 wherein the channel also extends substantially through at least one of a length and a width of the main unit.

3. The electronic apparatus in claim 1, wherein the channel permits equalization of air pressure in the electronic apparatus.

4. The electronic apparatus in claim 1, wherein the at least one vent orifice located on the outside of the electronic apparatus is sealed with a filter medium.

5. The electronic apparatus according to claim 4, wherein the filter medium includes a breathable material that admits moisture to flow in a first direction to exit the electronic apparatus but permits minimal moisture admission in a second direction to enter the electronic apparatus.

6. The electronic apparatus in claim 1, wherein the electronic apparatus is a mobile telephone constructed to be water-protected.

7. The electronic apparatus in claim 1, wherein the channel is arranged in a multi-layered or honeycomb structure.

8. The electronic apparatus in claim 1, wherein the channel is arranged as a spiral-shaped structure.

9. The electronic apparatus in claim 1, further comprising:
   one or more vent holes formed in a housing of the main unit in addition to the at least one vent orifice located on the outside of the electronic apparatus.

10. The electronic apparatus according to claim 9, wherein said one or more vent holes are formed in a housing of the power source.

11. The electronic apparatus in claim 1 wherein a cross-section of the channel varies along a length of the channel.

* * * * *